(12) United States Patent
Ando (10) Patent No.: US 7,679,212 B2
(45) Date of Patent: Mar. 16, 2010

(54) VEHICLE ACCESSORY TOUCH SWITCH

(75) Inventor: Yasuyuki Ando, Aichi-ken (JP)

(73) Assignee: Kojima Press Industry Co., Ltd. (JP)

( * ) Notice: Subject to any disclaimer, the term of this patent is extended or adjusted under 35 U.S.C. 154(b) by 77 days.

(21) Appl. No.: 12/053,160

(22) Filed: Mar. 21, 2008

(65) Prior Publication Data

US 2008/0309170 A1    Dec. 18, 2008

(30) Foreign Application Priority Data

Jun. 15, 2007   (JP) .............................. 2007-159189

(51) Int. Cl.
*B60L 1/00* (2006.01)
(52) U.S. Cl. ................................ 307/10.1; 307/132 EA
(58) Field of Classification Search ................ 307/10.1, 307/132 EA
See application file for complete search history.

(56) References Cited

U.S. PATENT DOCUMENTS

| 4,363,029 | A  | * | 12/1982 | Piliavin et al. ............. 340/501 |
| 5,239,152 | A  |   | 8/1993  | Caldwell et al. |
| 6,310,611 | B1 | * | 10/2001 | Caldwell ..................... 345/173 |
| 7,279,904 | B2 |   | 10/2007 | Sato |
| 7,498,822 | B2 | * | 3/2009  | Lee ............................ 324/662 |
| 2007/0001681 | A1 |   | 1/2007 | Sato |
| 2007/0211483 | A1 |   | 9/2007 | Ando et al. |

FOREIGN PATENT DOCUMENTS

| JP | 53-129874 A | 11/1978 |
| JP | 2006-196395 | 7/2006 |
| JP | 2006-321336 A | 11/2006 |
| JP | 2007-13432 A | 1/2007 |
| JP | 2007055551 | 3/2007 |

OTHER PUBLICATIONS

Japanese Office Action issued May 12, 2009 in corresponding Japanese Patent Application No. 2007-159189.

* cited by examiner

*Primary Examiner*—Robert L. Deberadinis
(74) *Attorney, Agent, or Firm*—Mills & Onello, LLP (57) ABSTRACT

A touch switch for controlling accessory equipment of a vehicle in such a manner that malfunctions caused by factors such as changes in atmospheric conditions, receipt of an electromagnetic impulse, or the like can be avoided. A vehicle accessory touch switch comprises a touch section having a sensor conductor plate which is touched by an operator, a capacitance measurement section which measures a change in electrostatic capacity of the sensor conductor plate to a ground conductor as a sensor conductor plate capacity change, and a control section which controls accessory equipment according to comparison between the sensor conductor plate capacity change and a control judgment value, wherein the vehicle accessory touch switch controls the accessory equipment according to an operator touching the touch section, a sub-conductor plate is disposed, the capacitance measurement section measures a change in electrostatic capacity between the sub-conductor plate and the ground conductor as a sub-conductor plate capacity change, and the control section decides the control judgment value according to the sub-conductor plate capacity change measured by the capacitance measurement section.

8 Claims, 9 Drawing Sheets

VEHICLE ACCESSORY TOUCH SWITCH

PRIORITY INFORMATION

This application claims priority to Japanese Patent Application No. 2007-159189 filed on Jun. 15, 2007, which is incorporated herein by reference in its entirety.

BACKGROUND OF THE INVENTION (a) Field of the Invention

The present invention relates to a touch switch for controlling accessory equipment of a vehicle according to a change in electrostatic capacitance caused when touched by a user.

(b) Description of the Prior Art(s)

Figure 8:
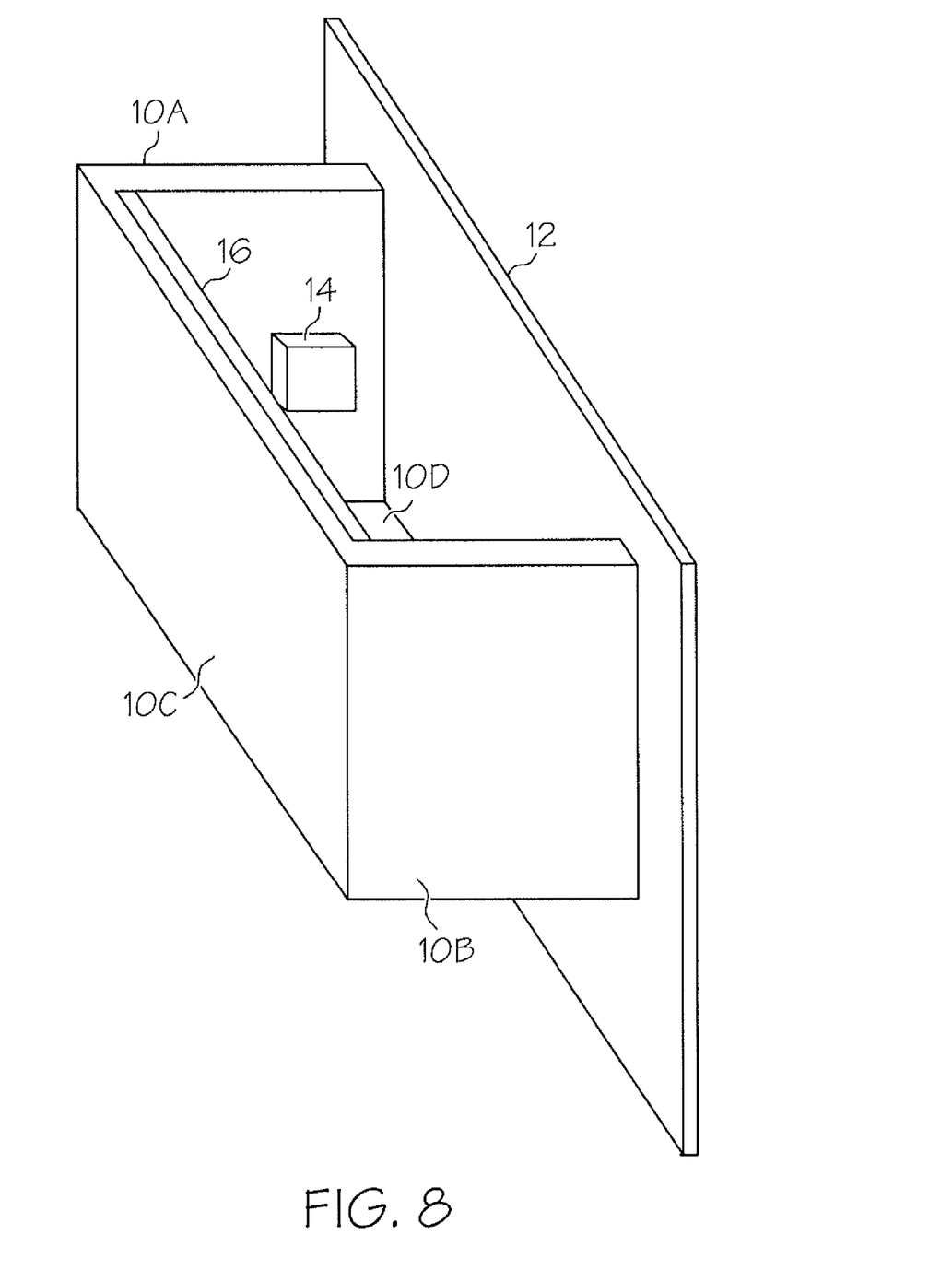
FIG. 8 is a diagram showing a door pocket in which a vehicle accessory touch switch is incorporated.

Generally, an inner-door panel of a vehicle has a door pocket in which items such as maps or the like are stored by a vehicle occupant. It is, however, often difficult to retrieve a desired item from such a door pocket because usually light does not fully reach into the door pocket interior. As one attempt to provide a solution, door pockets provided with a lamp which can be turned on and off with a touch switch are sometimes provides. FIG. 8 shows the structure of such a door pocket according to a related technology.

In this example, the door pocket is comprised of mutually opposed side walls 10A and 10B, a main wall 10C which is connected to the side walls 10A and 10B to form a U-shaped wall, and a bottom plate 10D which makes the bottom of the door pocket. The door pocket is fitted to an interior panel 12 such that an opening on the opposite side of the main wall 10C comes into contact with the door interior panel 12. A lamp 14 is attached to the inside surface of the side wall 10A of the door pocket. A touch plate 16 which configures a vehicle accessory touch switch is fixed to the inside surface of the main wall 10C of the door pocket. When the touch plate 16 is touched by a human hand to turn on the vehicle accessory touch switch, the lamp 14 is supplied with power and turned on.

By configuring as described above, the lamp 14 can be turned on when the vehicle occupant inserts his or her hand into the door pocket and touches the touch plate 16. Thus, the occupant can easily retrieve an item stored in the door pocket.

Figure 9:
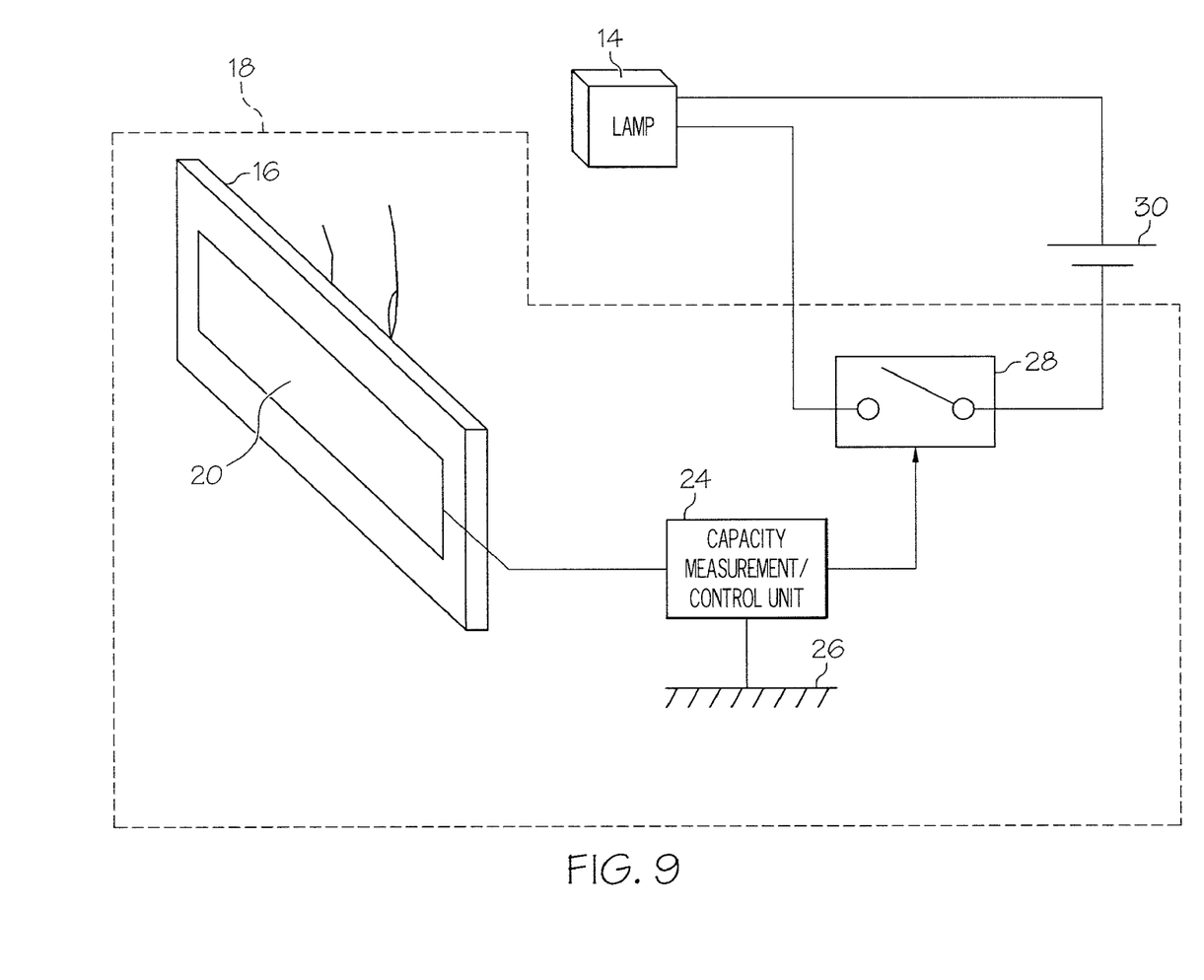
FIG. 9 is a diagram showing a structure of a general vehicle accessory touch switch.

FIG. 9 shows a structure of a vehicle accessory touch switch 18 applied to a door pocket. The touch plate 16 is formed of a dielectric material such as a synthetic resin or the like. A sensor conductor plate 20 is bonded to one surface of the touch plate 16 and connected to a capacitance measurement/control unit 24. The capacitance measurement/control unit 24 is connected to a ground conductor 26 having electric potential as reference.

A switch 28 is controlled to be in ON or OFF state by the capacitance measurement/control unit 24. One of the terminals of the switch 28 is connected to a negative terminal of a battery 30. The other terminal of the switch 28 is connected to one of terminals of the lamp 14. The other terminal of the lamp 14 is connected to the positive terminal of the battery 30.

The capacitance measurement/control unit 24 measures the electrostatic capacitance between the sensor conductor plate 20 and the ground conductor 26 (hereinafter, the electrostatic capacitance or capacity between the conductor plate and the ground conductor 26 is simply referred to as "the capacitance to ground") and controls the switch 28 if the measured value has a change which exceeds a prescribed control judgment value.

According to the above-described configuration, the capacitance to ground of the sensor conductor plate 20 can be changed when a surface of the touch plate 16, which is opposite to a surface to which the sensor conductor plate 20 is bonded, is touched with a human hand having electrostatic capacity with respect to the ground conductor 26. Thus, lighting of the lamp 14 can be controlled by touching the touch plate 16 with a hand.

A related technology of the present invention is described in JP-A 2006-196395.

However, because the capacitance to ground of the sensor conductor plate 20 is variable depending on a change in humidity or the like of air around the vehicle accessory touch switch 18, the vehicle accessory touch switch 18 may not function properly when the capacitance to ground is varied due to a change in atmospheric conditions. Also, a noise voltage may be induced in the conductor plate 20 by an unnecessary electromagnetic wave generated by other electric equipment, and an error occurs in the electrostatic capacitance measured by the capacitance measurement/control unit 24, possibly causing a malfunction of the vehicle accessory touch switch 18.

The present invention was achieved in view of the above-noted problems. Specifically, the present invention provides a touch switch for controlling accessory equipment of a vehicle that a malfunction which is caused by a factor due to changes in the environment such as a change of atmospheric conditions, receipt of an unrelated electromagnetic impulse, or the like can be avoided.

SUMMARY OF THE INVENTION

The present invention relates to a vehicle accessory touch switch, and may be configured to comprise a touch section having a sensor conductor plate which may be touched by a user, a capacitance measurement section which measures a change in electrostatic capacity of the sensor conductor plate to a ground conductor as a sensor conductor plate capacity change, and a control section which controls accessory equipment mounted on a vehicle according to comparison between the sensor conductor plate capacity change and a control judgment value, wherein the vehicle accessory touch switch controls the accessory equipment according to a user touch of the touch section, a sub-conductor plate is disposed independent of the sensor conductor plate, the capacitance measurement section measures a change in electrostatic capacity between the sub-conductor plate and the ground conductor as a sub-conductor plate capacity change, and the control section decides the control judgment value according to the sub-conductor plate capacity change measured by the capacitance measurement section.

According to the present invention, a vehicle accessory touch switch capable of avoiding a malfunction caused by an environmental change can be realized.

DESCRIPTION OF THE PREFERRED EMBODIMENT

Figure 1:
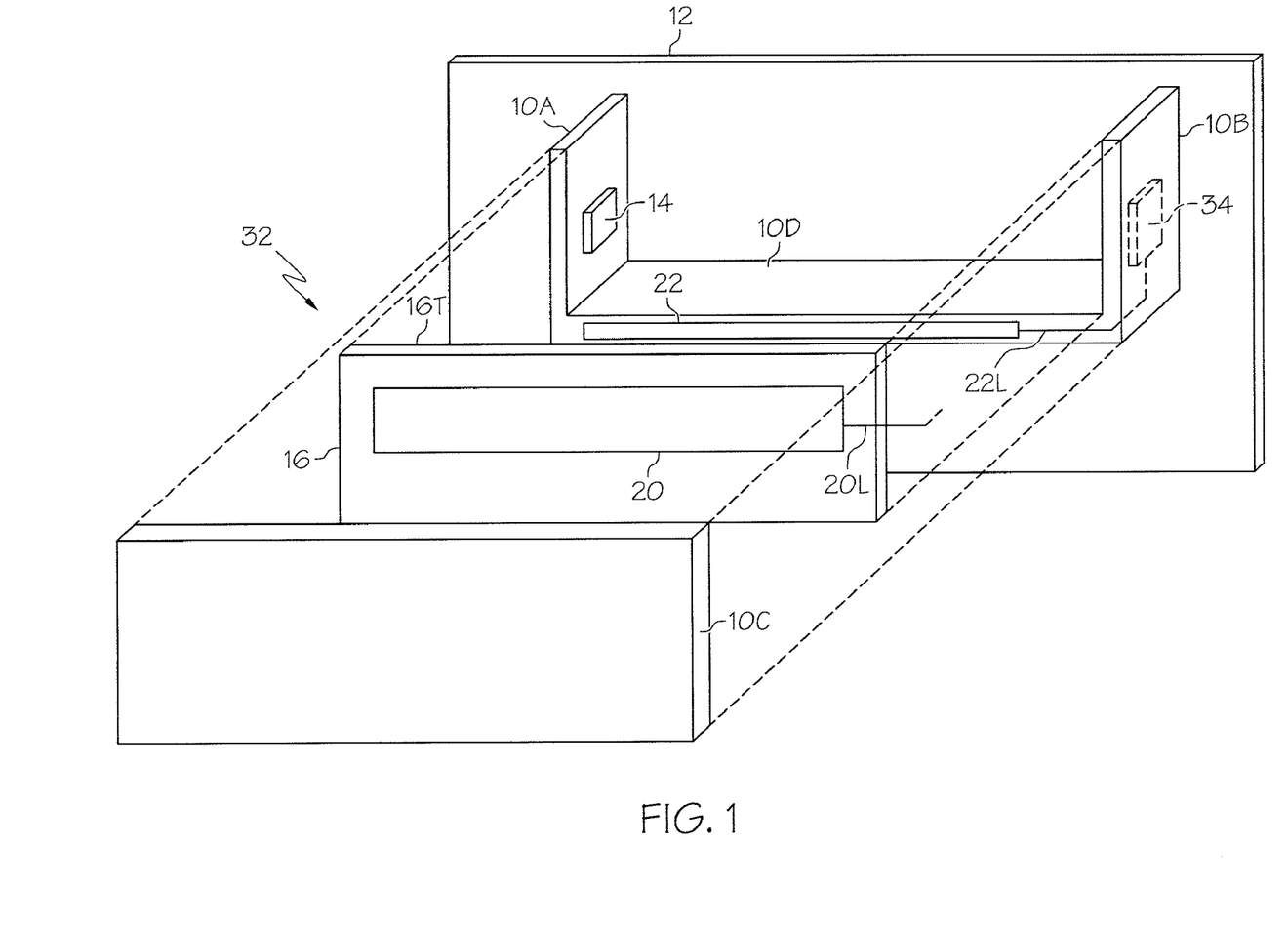
FIG. 1 is an exploded view of a vehicle accessory touch switch.
Figure 2:
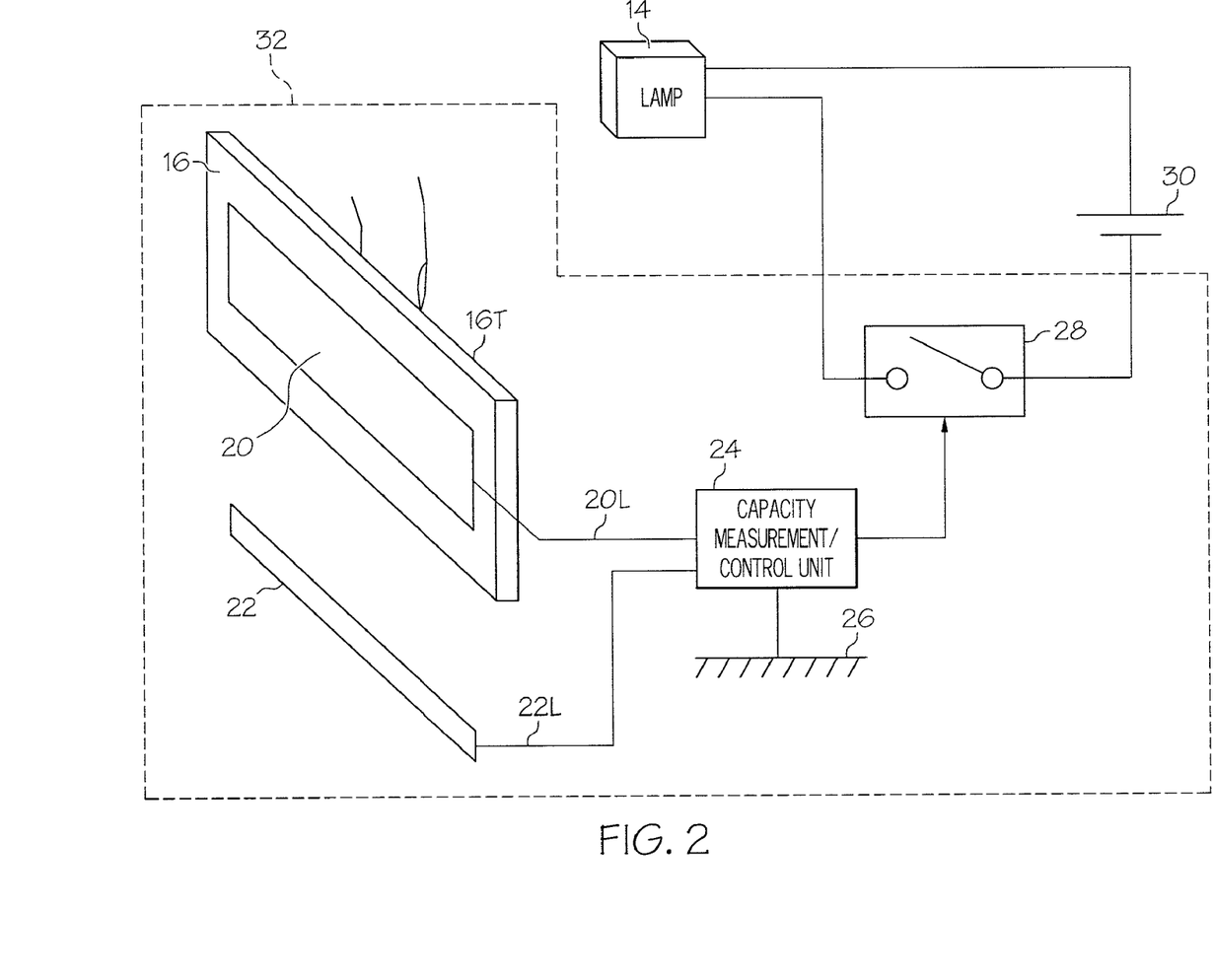
FIG. 2 is a diagram showing a vehicle accessory touch switch.

FIG. 1 shows an exploded view of a vehicle accessory touch switch 32 according to an embodiment of the invention which is incorporated into a door pocket. FIG. 2 shows a structure of the vehicle accessory touch switch 32. Component parts corresponding to those of FIG. 8 and FIG. 9 are denoted by the same reference numerals, and their descriptions will not be repeated. The vehicle accessory touch switch 32 has a touch plate 16 provided with a sensor conductor plate 20, and a sub-conductor plate 22 disposed on a side surface of a bottom plate 10D to which a main wall 10C is affixed.

The sensor conductor plate 20 and the sub-conductor plate 22 are connected with conductor wires 20L and 22L, respectively, and the conductor wires 20L and 22L are connected to a capacitance measurement/control unit 24 which is built into the side wall 10B. The touch plate 16 is fixed to the inside surface of the main wall 10C of the door pocket. The vehicle accessory touch switch 32 controls to turn on a lamp 14 disposed within the door pocket.

The structure and operation of the vehicle accessory touch switch 32 will be described with reference to FIG. 2. The sensor conductor plate 20 is disposed on a surface opposite to the touch plate 16 having a touch surface 16T which can be touched by a human hand. The sub-conductor plate 22 is disposed at a position where its capacitance to ground is not markedly changed even if the touch plate 16 is touched. Additionally, the sub-conductor plate 22 is disposed near the sensor conductor plate 20. A distance between the sub-conductor plate 22 and the sensor conductor plate 20 is such a distance that a change (an environmental change in the vicinity of the vehicle accessory touch switch 32) due to an environmental change of the capacitance to ground of the sub-conductor plate 22 becomes equal to a change due to an environmental change of the capacitance to ground of the sensor conductor plate 20.

The capacitance measurement/control unit 24 is connected to a ground conductor 26. As the ground conductor 26, the vehicle body may be suitably used.

A switch 28 is controlled by a control signal output by the capacitance measurement/control unit 24. For the switch 28, a semiconductor device circuit which is controlled by inputting a pulse signal indicating a high electric potential with respect to an electric potential of the ground conductor 26 for a prescribed time length is suitably used. For the switch 28, a switch which is changed to an OFF state if it is in an ON state, and to an ON state if it is in an OFF state, each time the control signal is input can be used.

According to the structure of the vehicle accessory touch switch 32 shown in FIG. 1 and FIG. 2, the sub-conductor plate 22 is disposed at a position where its capacitance to ground is not markedly changed even if the touch plate 16 is touched with a human hand. Therefore, the capacitance to ground of the sub-conductor plate 22 is changed by an environmental change which can be detected by detecting that the capacitance to ground of the sub-conductor plate 22 has changed.

The sub-conductor plate 22 is disposed near the sensor conductor plate 20. Therefore, when the capacitance to ground of the sub-conductor plate 22 is changed, the capacitance to ground of the sensor conductor plate 20 is also changed by the environmental change which has changed the capacitance to ground of the sub-conductor plate 22. Therefore, the change in the capacitance to ground of the sensor conductor plate 20 due to the environmental change can be detected by detecting that the capacitance to ground of the sub-conductor plate 22 has changed.

Accordingly, the vehicle accessory touch switch 32 according to this embodiment determines a control judgment value with respect to the capacitance to ground of the sensor conductor plate 20 based on the change in the capacitance to ground of the sub-conductor plate 22 and adjusts control sensitivity.

Figure 3:
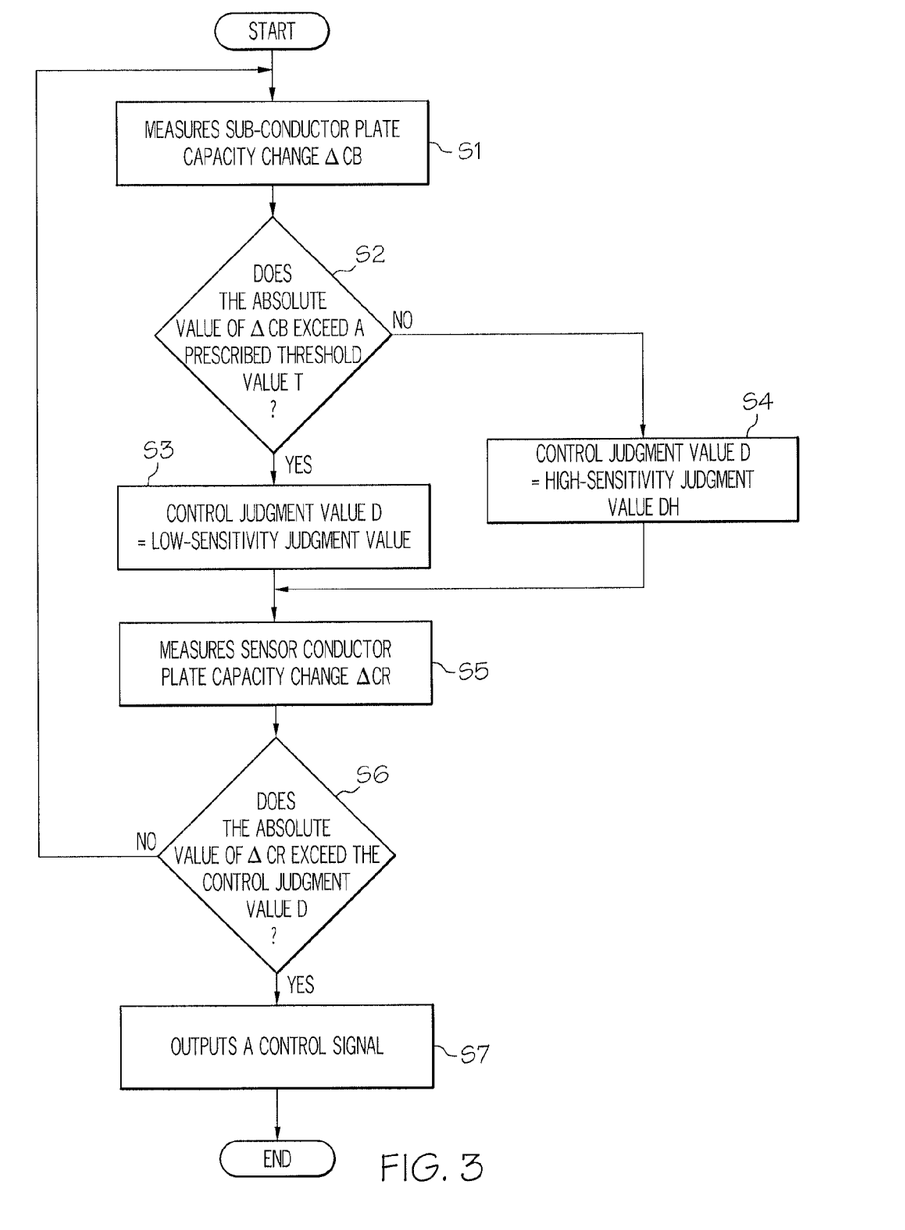
FIG. 3 is a flowchart showing a processing performed by a capacitance measurement/control unit.

Processing performed by the vehicle accessory touch switch 32 when adjusting the control sensitivity will next described. FIG. 3 shows a flowchart of the processing. The capacitance measurement/control unit 24 measures a change in the capacitance to ground of the sub-conductor plate 22 as a sub-conductor plate capacity change $\Delta CB$ (S1). The change in electrostatic capacity can be measured by, for example, measuring electrostatic capacity at intervals of a prescribed time $\Delta t$ and determining a difference obtained by subtracting from the measured electrostatic capacity value obtained at a prescribed time the measured electrostatic capacity value which is obtained earlier by the time $\Delta t$ than the time when the measured value is obtained. The electrostatic capacity is preferably measured by impedance measurement, measurement based on a charging time constant or the like.

The capacitance measurement/control unit 24 judges whether the absolute value of the sub-conductor plate capacity change $\Delta CB$ exceeds a prescribed threshold value T (S2). If the absolute value of the sub-conductor plate capacity change $\Delta CB$ exceeds the threshold value T, a control judgment value D is set to a low-sensitivity judgment value DL (S3). Meanwhile, if the absolute value of the sub-conductor plate capacity change $\Delta CB$ is equal to the threshold value T or less, the control judgment value D is set to a high-sensitivity judgment value DH (S4). The low-sensitivity judgment value DL is determined to be a value larger than the high-sensitivity judgment value DH.

The capacitance measurement/control unit 24 processes in the same manner as that for measurement of the sub-conductor plate capacity change $\Delta CB$ to measure a change in the capacitance to ground of the sensor conductor plate 20 as a sensor conductor plate capacity change $\Delta CR$ (S5).

The capacitance measurement/control unit 24 judges whether the absolute value of the sensor conductor plate capacity change $\Delta CR$ exceeds the control judgment value D set in the step S4 or S5 (S6). If the absolute value of the sensor conductor plate capacity change $\Delta CR$ is not larger than the control judgment value D, the processing returns to the processing of the step S1. Meanwhile, if the absolute value of the sensor conductor plate capacity change $\Delta CR$ exceeds the control judgment value D, a control signal instructing the switching of the switch 28 is output (S7). As the control signal, a pulse signal may be suitably used.

If the switch 28 is in an OFF state when the control signal is input, the switch 28 is changed to an ON state to turn on the lamp 14. And, if the switch 28 is in the ON state, it is changed to the OFF state to turn off the lamp 14.

By the above processing, the control judgment value D is set to a high-sensitivity judgment value DH if the environment around the vehicle accessory touch switch 32 is stable and the absolute value of the sensor conductor plate capacity change ΔCR is not larger than the threshold value T. Meanwhile, if the environment around the vehicle accessory touch switch 32 changes and the absolute value of the sensor conductor plate capacity change ΔCR exceeds the threshold value T, the control judgment value D is set to the low-sensitivity judgment value DL.

Here, the low-sensitivity judgment value DL is a value larger than the high-sensitivity judgment value DH. Therefore, if the environment around the vehicle accessory touch switch 32 changes, a value larger than the value which is set when the environment is stable is set as the control judgment value D. At step S6 the control judgment value D indicates a level of change in the capacitance to ground of the sensor conductor plate 20 required for control of the switch 28.

Therefore, if the environment around the vehicle accessory touch switch 32 changes, a change in the capacitance to ground of the sensor conductor plate 20 required for control of the switch 28 becomes larger than when the environment is stable. Thus, the capacitance to ground of the sensor conductor plate 20 is changed by the environmental change, and malfunctioning of the vehicle accessory touch switch 32 can be avoided.

The low-sensitivity judgment value DL is determined under a condition that it is less than the absolute value of the sensor conductor plate capacity change ΔCR at the time when a human hand touches the touch surface 16T in addition to the condition that it is a value sufficient to avoid a malfunction. When the low-sensitivity judgment value DL is determined in this manner, the absolute value of the sensor conductor plate capacity change ΔCR exceeds the control judgment value D when the touch surface 16T is touched by a human hand. Thus, a human touch will cause the capacitance measurement/control unit 24 (S6, S7) to output the control signal, and the switch 28 can be controlled.

Meanwhile, it is preferable that the high-sensitivity judgment value DH is decided according to the operability of the vehicle accessory touch switch 32. In other words, a distance between the human hand and the touch surface 16T when the control signal is output in the step S7 is set, and the high-sensitivity judgment value DH is determined such that the control signal is output when a human hand comes closer than the preset distance to the touch surface 16T. It is preferable that the low-sensitivity judgment value DL and the high-sensitivity judgment value DH are decided through experimental evaluation, simulation, or the like.

Figure 4:
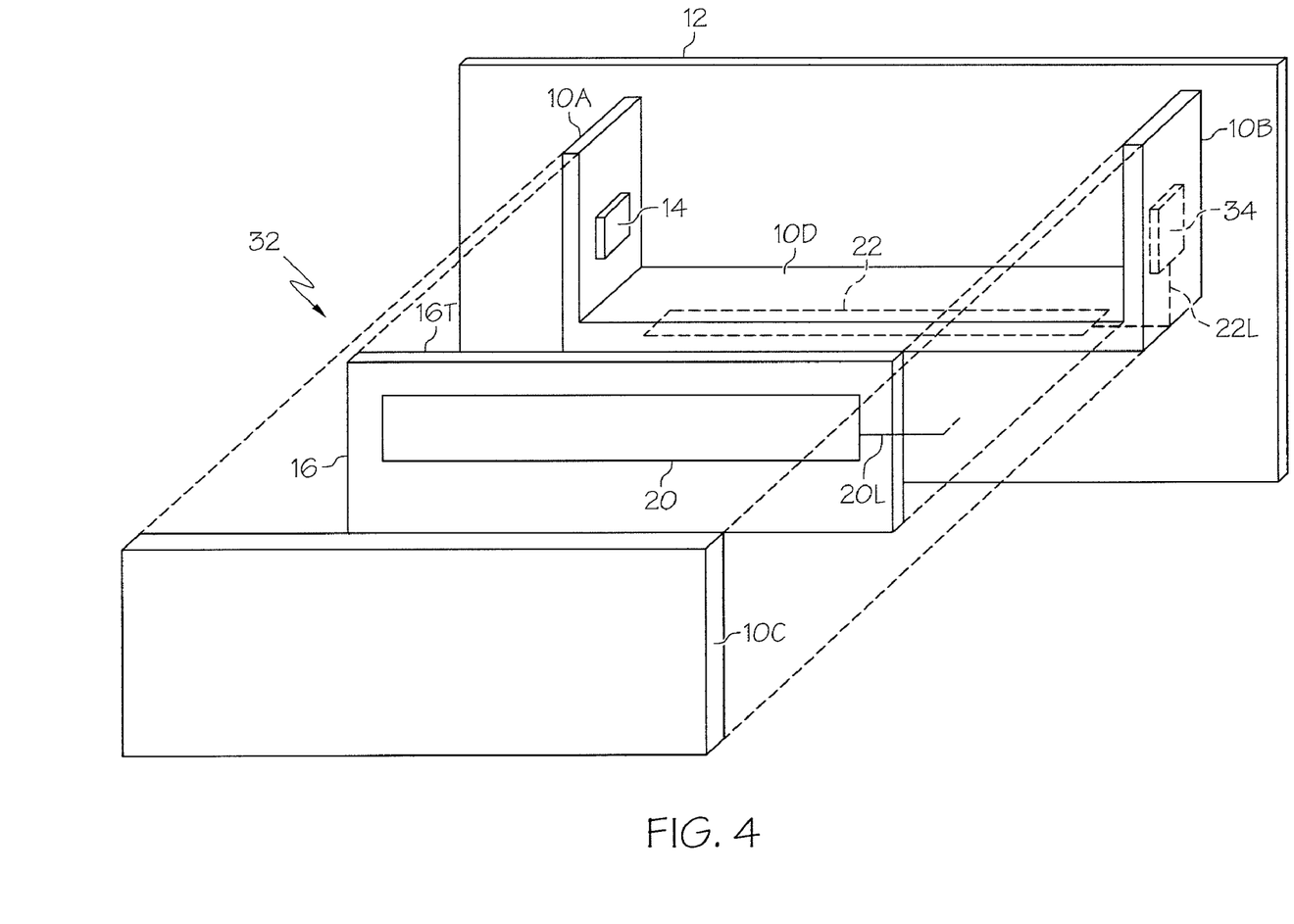
FIG. 4 is an exploded view of a vehicle accessory touch switch with a sub-conductor plate disposed on a bottom plate of a door pocket.

Although an example in which the sub-conductor plate 22 is disposed on the side surface of the bottom plate 10D was described above, the present invention may also be configured such that the sub-conductor plate 22 is disposed on the outside surface of the bottom plate 10D of the door pocket as shown in FIG. 4.

Figure 5:
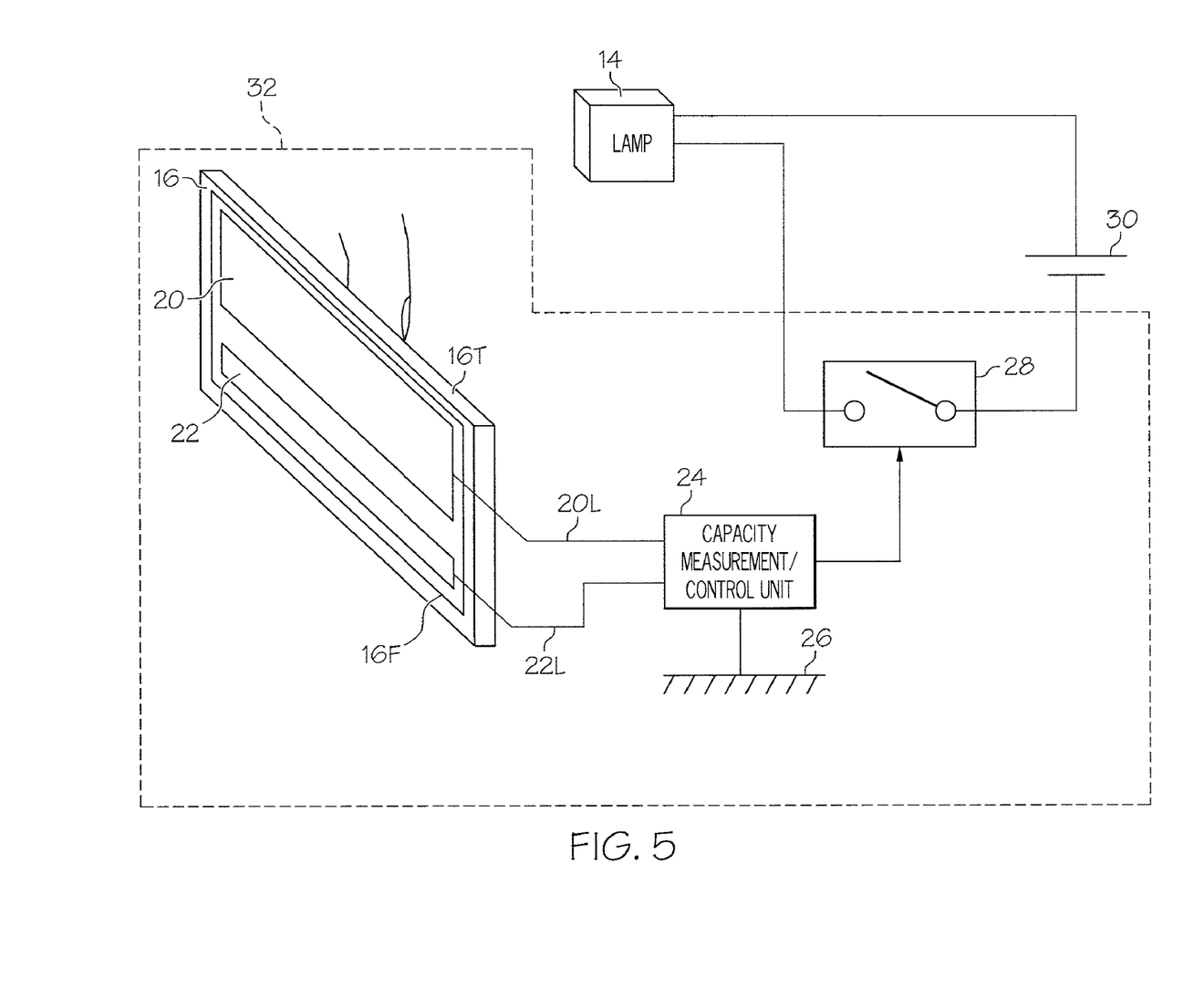
FIG. 5 is a diagram showing a touch plate with a sub-conductor plate disposed in a vicinity of a lower end of a touch plate.

As shown in FIG. 5, the sub-conductor plate 22 may be disposed near a lower end of the touch plate 16. The sub-conductor plate 22 is disposed at a position separated as much as possible from the portion which is touched by a human hand. In the structure of FIG. 5, the sensor conductor plate 20 and the sub-conductor plate 22 are disposed on the same flexible substrate 16T and affixed to the touch plate 16.

Figure 6:
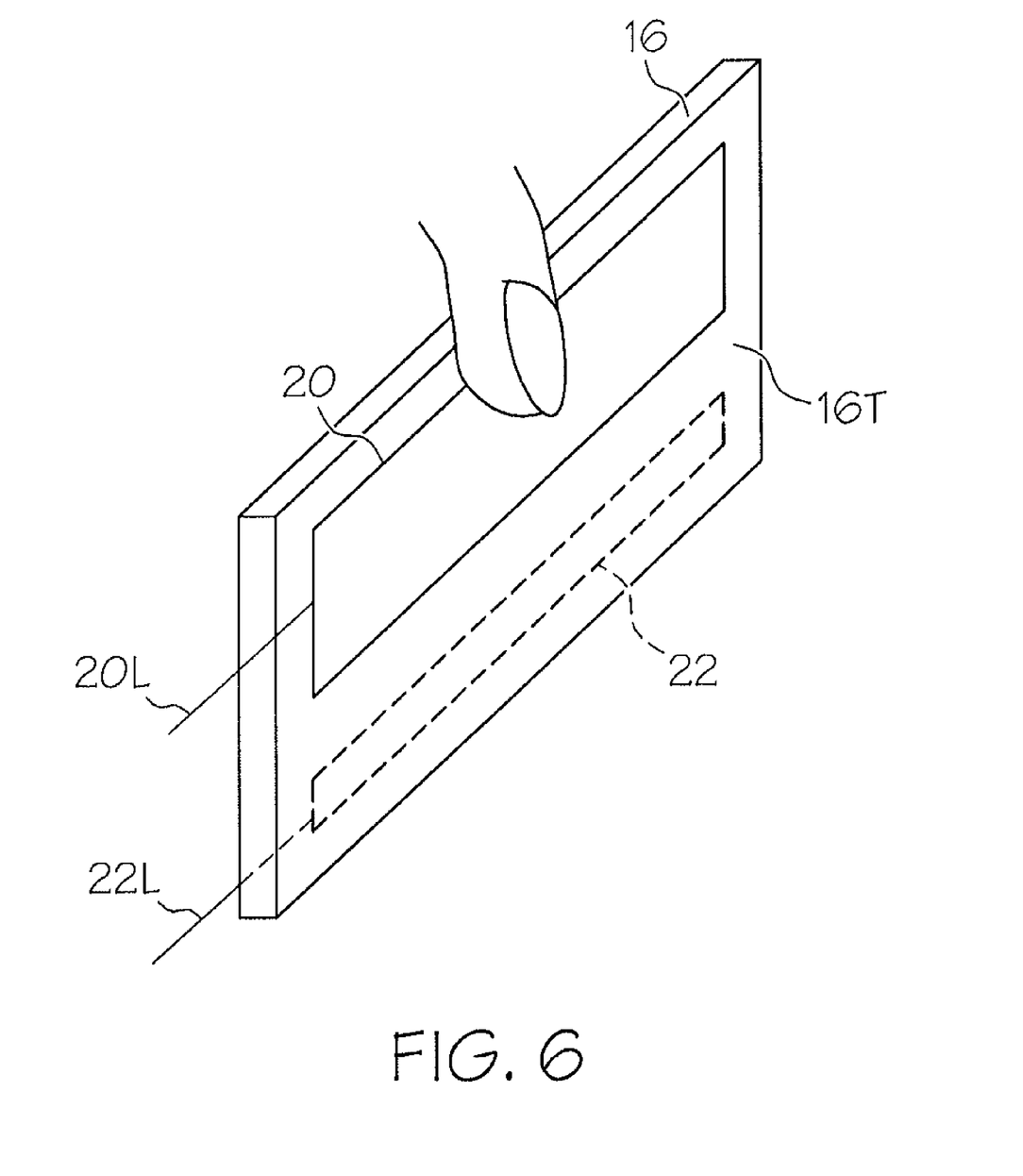
FIG. 6 is a diagram showing a touch plate having a sensor conductor plates disposed on a touch surface.

In addition, the touch plate 16 may be configured such that the sensor conductor plate 20 is provided on the touch surface 16T as shown in FIG. 6. The capacitance measurement/control unit 24 measures a change in the capacitance to ground of the sensor conductor plate 20 due to a contact or approach of the human hand to the sensor conductor plate 20 and controls the switch 28 according to the measured result. The sub-conductor plate 22 may be disposed on a surface opposite to the touch surface 16T, a side surface of the bottom plate 10D to which the main wall 10C is bonded, an outer side surface of the bottom plate 10D of the door pocket, or the like.

For the switch 28 provided on the vehicle accessory touch switch 32, a switch which is changed from an OFF state to an ON state when a control signal is input and then changed to the OFF state after maintaining the ON state for a prescribed time period may be employed. When such a switch is used, the lamp 14 is lit for a prescribed time period after the touch plate 16 is touched by a human hand and goes off automatically. Thus, a person operating the lamp 14 can be freed from the burden of touching the touch plate 16 again in order to turn off the lamp 14.

Figure 7:
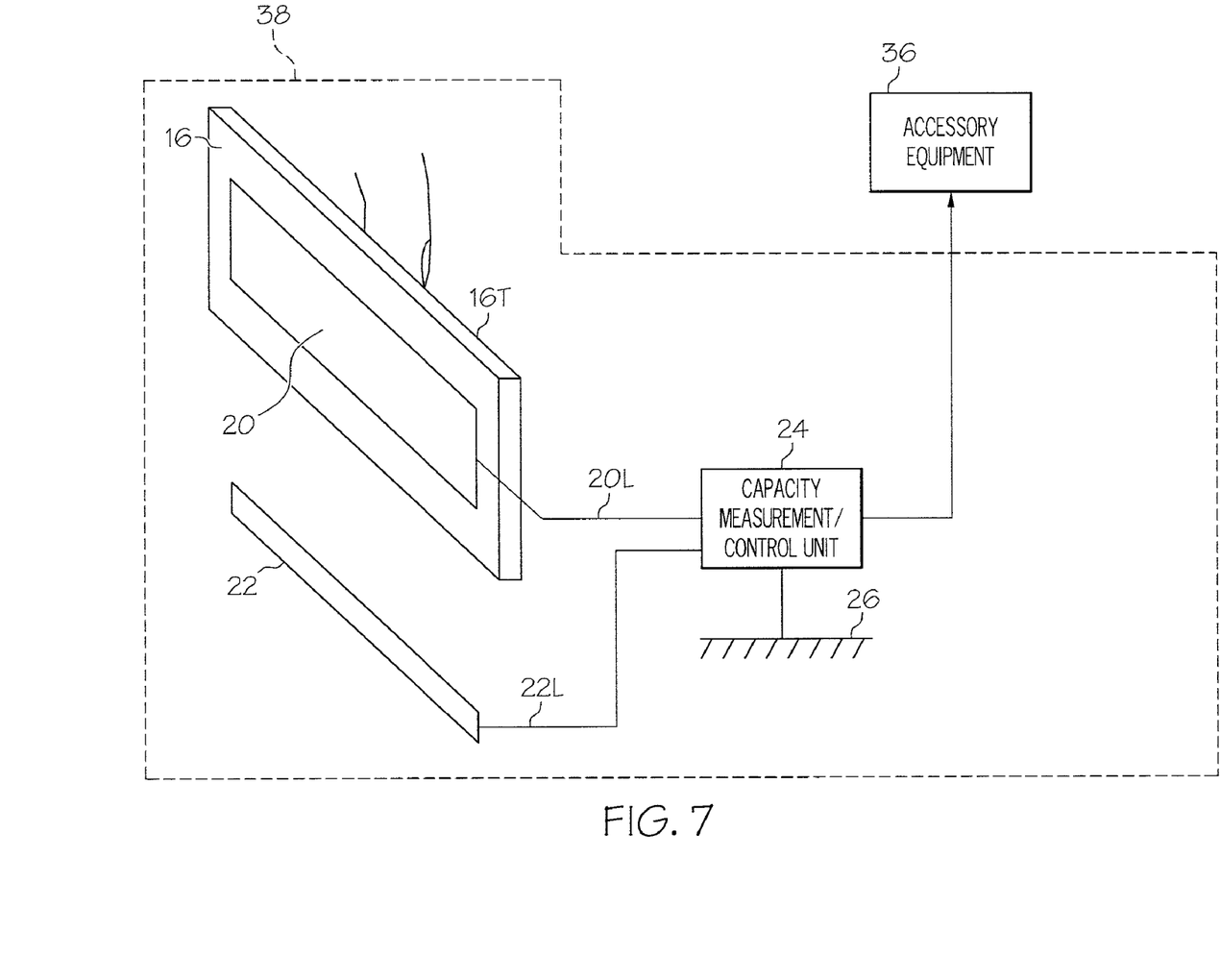
FIG. 7 is a diagram showing a vehicle accessory touch switch for controlling accessory equipment.

The vehicle accessory touch switch can be applied to the control of accessory equipment installed on the vehicle, such as automatic windows, an interior light, a radio, an air conditioner, and the like, in addition to the control of the switch 28. An example vehicle accessory touch switch 38 for controlling such accessory equipment 36 is shown in FIG. 7. In this figure, component parts corresponding to those of FIG. 2 are denoted by the same reference numerals, and their description will not be repeated. The capacitance measurement/control unit 24 controls the accessory equipment 36 in FIG. 7. Generally, an accessory equipment control circuit is provided with a semiconductor device circuit which can control according to a pulse signal. Therefore, it can also control, for example, opening/closing of an automatic window, adjustment of an interior light, tuning of a radio, temperature setting of an air conditioner, and the like.

What is clamed is:

1. A vehicle accessory touch switch, comprising:
   a touch section having a sensor conductor plate which is touched by an operator,
   a capacitance measurement section which measures a change in electrostatic capacity of the sensor conductor plate to a ground conductor as a sensor conductor plate capacity change, and
   a control section which controls accessory equipment mounted on a vehicle according to comparison between the sensor conductor plate capacity change and a control judgment value, wherein:
   the vehicle accessory touch switch controls the accessory equipment according to a touch by the operator to the touch section,
   a sub-conductor plate is disposed independent of the sensor conductor plate,
   the capacitance measurement section measures a change in electrostatic capacity between the sub-conductor plate and the ground conductor as a sub-conductor plate capacity change, and
   the control section decides the control judgment value according to the sub-conductor plate capacity change measured by the capacitance measurement section.

2. The vehicle accessory touch switch according to claim 1, wherein the control section controls the accessory equipment if the absolute value of the sensor conductor plate capacity change exceeds the control judgment value, and decides the control judgment value when the absolute value of the sub-conductor plate capacity change exceeds a prescribed threshold value as a value larger than the control judgment value when the absolute value of the sub-conductor plate capacity change is not larger than the prescribed threshold value.

3. The vehicle accessory touch switch according to claim 1, wherein the touch section is a touch plate formed of a dielectric of which the sensor conductor plate is disposed on one surface.

4. The vehicle accessory touch switch according to claim 3, wherein the sensor conductor plate is disposed on a surface such that the operator can touch the sensor conductor.

5. The vehicle accessory touch switch according to claim 3, wherein the sensor conductor plate is disposed on a surface opposite to the surface touched by the operator.

6. The vehicle accessory touch switch according to claim 3, wherein the sub-conductor plate is disposed on a surface opposite to the surface touched by the operator.

7. The vehicle accessory touch switch according to claim 1, wherein the touch section is disposed on a vehicle door pocket, and the sub-conductor plate is disposed at a position in the door pocket not touched by the person.

8. The vehicle accessory touch switch according to claim 1, wherein the touch switch controls the on or off state of a lamp disposed within the door pocket.

* * * * *